United States Patent
Upadhyaya

(10) Patent No.: US 8,717,115 B2
(45) Date of Patent: May 6, 2014

(54) RESONATOR CIRCUIT AND METHOD OF GENERATING A RESONATING OUTPUT SIGNAL

(75) Inventor: Parag Upadhyaya, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 142 days.

(21) Appl. No.: 13/350,501

(22) Filed: Jan. 13, 2012

(65) Prior Publication Data

US 2013/0181783 A1 Jul. 18, 2013

(51) Int. Cl.
*H03L 1/00* (2006.01)

(52) U.S. Cl.
USPC .. 331/176; 331/167; 331/117 R; 331/117 FE; 331/177 V

(58) Field of Classification Search
USPC ............ 331/176, 167, 177 V, 117 R, 117 FE
See application file for complete search history.

(56) References Cited

U.S. PATENT DOCUMENTS

| | | |
|---|---|---|
| 2004/0189417 A1 | 9/2004 | Fujita |
| 2005/0128017 A1 | 6/2005 | Meltzer |
| 2007/0096839 A1* | 5/2007 | Meissner ................ 331/176 |
| 2009/0102568 A1 | 4/2009 | Lu et al. |
| 2009/0261917 A1 | 10/2009 | Taghivand et al. |
| 2010/0244969 A1* | 9/2010 | Tsai et al. .............. 331/66 |

FOREIGN PATENT DOCUMENTS

WO  WO 2005/10437 A1  11/2005

OTHER PUBLICATIONS

U.S. Appl. No. 12/906,017, filed Oct. 15, 2010, Upadhyaya et al.

* cited by examiner

*Primary Examiner* — Arnold Kinkead
(74) *Attorney, Agent, or Firm* — John J. King; Lois D. Cartier

(57) ABSTRACT

A resonator circuit enabling temperature compensation includes an inductor coupled between a first node and a second node of the resonator circuit; a capacitor circuit coupled between the first node and the second node; and a temperature compensation circuit coupled between the first node and the second node. The temperature compensation circuit comprises a varactor coupled to receive a temperature control signal that sets the capacitance of the varactor. A method of generating a resonating output is also disclosed.

16 Claims, 6 Drawing Sheets

RESONATOR CIRCUIT AND METHOD OF GENERATING A RESONATING OUTPUT SIGNAL

FIELD OF THE INVENTION

The present invention relates generally to integrated circuits, and in particular, to a resonator circuit and a method of generating a resonating output signal.

BACKGROUND

Resonating circuits are an important class of circuits in integrated circuit devices and electronic systems in general. One type of circuit for generating an oscillating signal is a voltage controller oscillator (VCO). A VCO is a circuit which generates an oscillating signal, the frequency of which varies based upon a control voltage signal provided to the VCO. Because the frequency of an output signal of a VCO may vary over time or based upon variations in operating conditions for the device, it may be required that the control voltage signal provided to the VCO be adjusted to ensure that the correct output signal is generated.

VCOs having an inductor and a capacitor (LC VCOs) are sensitive to process, voltage and temperature (PVT) variations. The process and voltage usually are compensated for when a certain carrier frequency is selected for a given process. The temperature, however, can vary significantly from application to application. The thermal sensitivity of LC VCOs can affect the performance of a device implementing the VCO. For example, if frequency varies significantly as a result of the temperature variation, the VCO may have to be reset. Such a reset will lead to a break in a communication link for example. Further, the VCO gain may vary, resulting bandwidth fluctuation. Such bandwidth fluctuations may be particularly significant in phase locked loop (PLL) applications. The bandwidth fluctuation will result in jitter variation.

SUMMARY

A resonator circuit enabling temperature compensation is described. The resonator circuit comprises an inductor coupled between a first node and a second node of the resonator circuit; a capacitor circuit coupled between the first node and the second node; and a temperature compensation circuit coupled between the first node and the second node, the temperature compensation circuit comprising a varactor coupled to receive a temperature control signal that sets the capacitance of the varactor.

The resonator circuit may further comprise a first transistor having a first terminal coupled to the first node and a second terminal coupled to a ground potential, and a second transistor having a third terminal coupled to the second node and a fourth terminal coupled to the ground potential, wherein a first control terminal of the first transistor is coupled to the second node and a second control terminal of the second transistor is coupled to the first node. The capacitor circuit may be a variable capacitor coupled to receive a tuning signal, where the resonator circuit generates an output signal of a predetermined frequency in response to the tuning signal. The capacitor circuit may comprise a plurality of varactors coupled to receive tuning signals for enabling the resonator circuit to generate an output of a predetermined frequency. The temperature compensation circuit may generate a linear output as a function of a temperature of an integrated circuit having the resonator circuit. The temperature compensation circuit may comprise a bipolar junction transistor. The resonator circuit may be implemented in a phase locked loop circuit.

According to an alternate embodiment, a resonator circuit enabling temperature compensation comprises an inductor coupled between a first node and a second node of the resonator circuit; a capacitor circuit coupled in parallel with the inductor between the first node and the second node; a temperature sensor generating a temperature control signal; and a varactor coupled between the first node and the second node, the varactor receiving the temperature control signal to set the capacitance of the varactor.

The resonator circuit may be coupled to receive a current signal from a programmable current source. The capacitor circuit may comprise a varactor, wherein the resonator circuit generates an output signal of a predetermined frequency in response to the current signal and the temperature control signal. The capacitor circuit may comprise a plurality of varactors coupled to receive tuning signals for enabling the resonator circuit to generate an output of a predetermined frequency. The temperature sensor may generate a linear output as a function of temperature. The temperature sensor may comprise a bipolar junction transistor. The temperature sensor may adjust a frequency of the resonator circuit in response to changes in temperature.

A method of generating a resonating output signal is also described. The method comprises setting a capacitance of a tunable resonant circuit; detecting a temperature of an integrated circuit having the tunable resonant circuit; generating a temperature control signal; selecting a capacitance of a temperature compensation circuit in response to the temperature control signal; and generating the resonating output signal based upon the capacitance of the resonator circuit and the capacitance of the temperature compensation circuit.

The method may further comprise periodically updating the temperature control signal, and adjusting a frequency of the resonating output signal in response to changes in the detected temperature. Generating a temperature control signal may comprise generating a linear control signal that is linearly proportional to a temperature of an integrated circuit having the tunable resonator circuit. A programmable current may also be coupled to the resonator circuit. Generating the resonating output signal may comprise generating an output of a phase locked loop.

DETAILED DESCRIPTION

Figure 1:
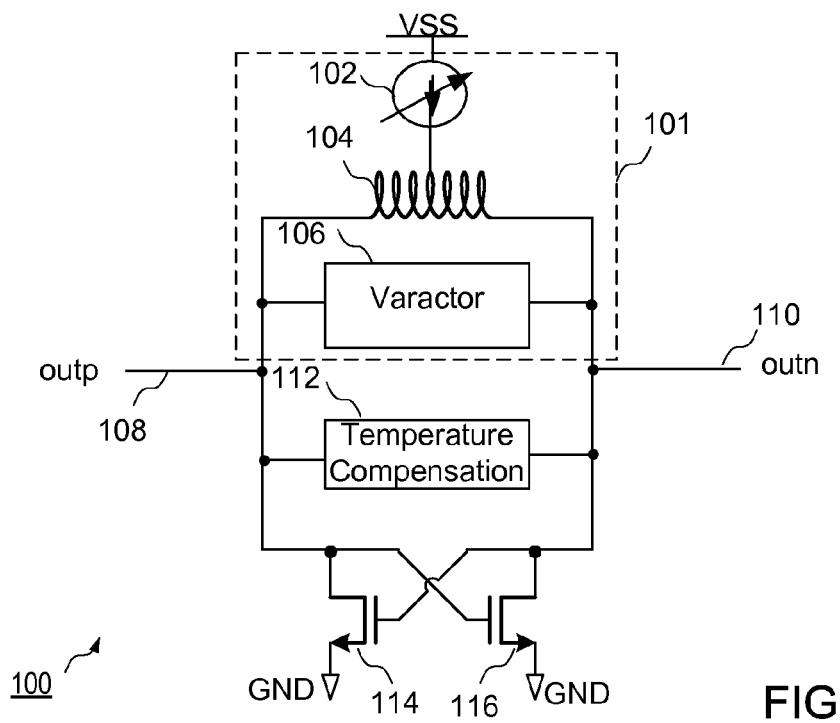
FIG. 1 is a block diagram of a resonator circuit enabling temperature compensation according to an embodiment.

Turning first to FIG. 1, a block diagram of a resonator circuit enabling temperature compensation is shown. The resonator circuit 100 is an LC VCO having a tunable resonant circuit 101. The tunable resonant circuit 101 includes a current source 102 coupled to an inductor 104. The terminals of the inductor 104 and terminals of a variable capacitor (varactor) 106 are coupled to an output 108 (outp) and an output 110 (outn) of the resonator circuit. A temperature compensation circuit 112 and cross-coupled transistors 114 and 116 are also coupled across the outputs 108 and 110 of the resonator circuit as shown. That is, transistor 114 has a first terminal coupled to node 108 and a second terminal coupled to a ground potential, and transistor 116 has a first terminal coupled to node 110 and a second terminal coupled to the ground potential, wherein a control terminal of the first transistor is coupled to node 110 and a control terminal of transistor 116 is coupled to the node 110. Additional details related to the tunable resonant circuit 101 is described in reference to FIG. 2

The temperature compensation circuit 112 is designed to counteract the frequency variation in the tunable resonant circuit 101. The tunable resonant circuit 101 is a resonant oscillator whose frequency depends on effective inductance (L) and effective capacitance (C) between the outputs 108 and 110. Typically, an LC oscillator has fixed inductance, while the capacitance is tuned via a varactor to achieve relatively narrow frequency tuning range. A wide band LC VCO is formed using a switching bank of coarse capacitors and fine tuning varactors along with a fixed inductor. The tuning range of the LC VCO limits the range of data rates in serializer/deserializer (SERDES) and radio frequency (RF) applications. Coarse capacitor tuning banks can be formed using metal-oxide-metal (MOM) capacitors in combination with series FET switches. The VCO frequency range then is divided by switched capacitor banks. Therefore, once the coarse capacitance is fixed for a given process, a varactor is used to tune the frequency within a narrow frequency range over voltage and temperature variations.

The frequency of a VCO can vary significantly, depending on application, due to thermal fluctuation. Once the VCO has been calibrated at a temperature in a SERDES application, it must stay within that band or else the system would have to be reset and recalibrated to a new temperature. The loss of the VCO signal during this recalibration process is highly undesirable. Furthermore, the temperature variation may result in a VCO gain which may be varying as the control voltage is adjusting the VCO to maintain same frequency in a PLL application. This temperature variation results in bandwidth fluctuation and jitter variation, where the LC VCO frequency generally slows down with an increase temperature.

Figure 2:
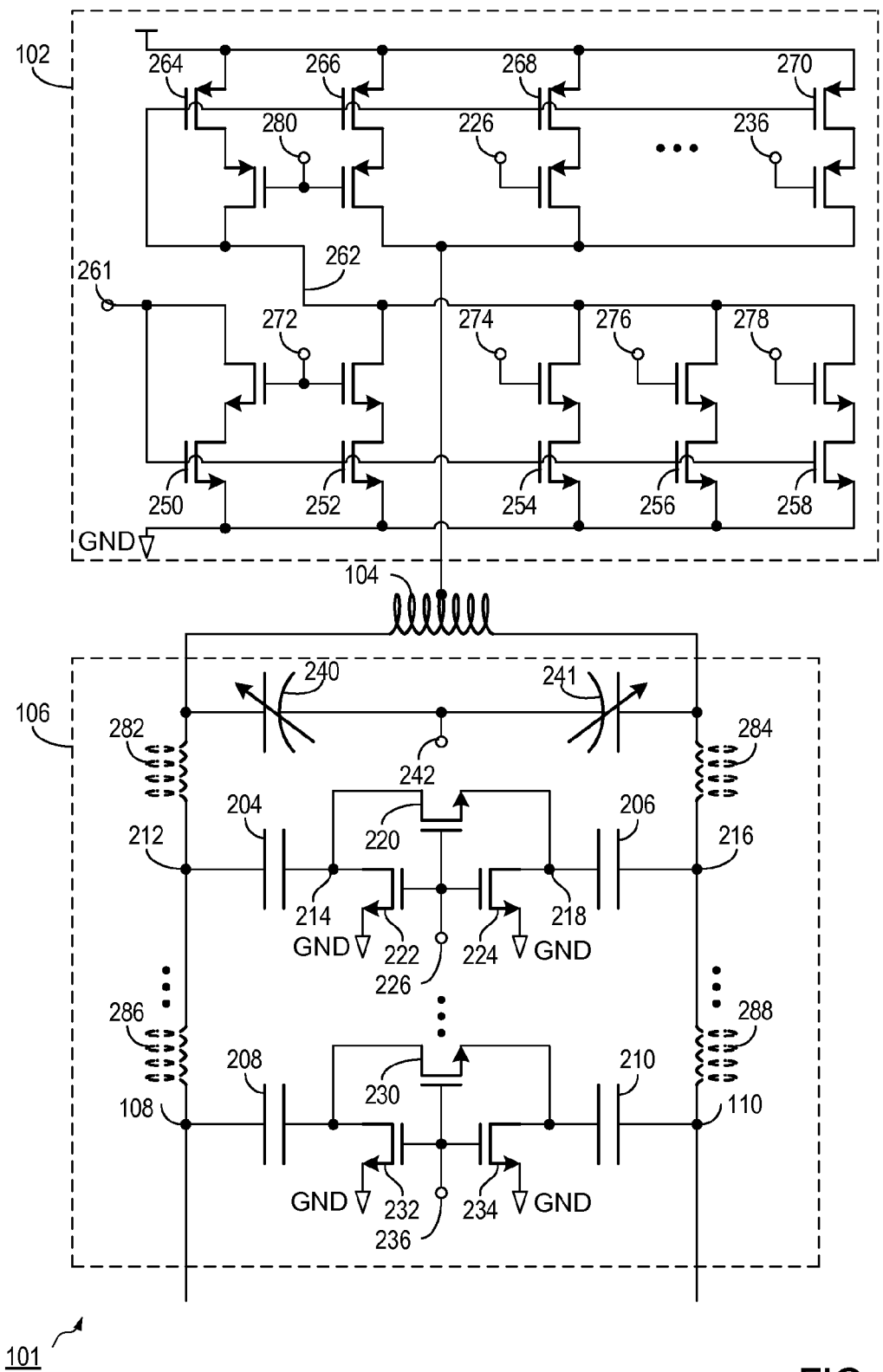
FIG. 2 is a block diagram of a tunable resonant circuit of the resonator circuit of FIG. 1 according to an embodiment.

Turning now to FIG. 2, a block diagram of the tunable resonant circuit 101 of the resonator circuit of FIG. 1 is shown. The resonance frequency of the tunable resonant circuit 101 sets the frequency of the resonator circuit 100 using the current source 102, the inductor 104, and the varactor 106. Thus, the frequency of the resonator circuit 100 is adjusted by tuning the frequency of the tunable resonant circuit 101.

The tunable resonant circuit 101 includes multiple pairs of capacitors, such as the pair of capacitors 204 and 206 through a pair of capacitors 208 and 210. The capacitance that capacitor 204 provides between its electrodes 212 and 214 matches the capacitance that capacitor 206 provides between its electrodes 216 and 218. Similarly, the pair of capacitors 208 and 210 has matched capacitance.

Each capacitor pair has an associated switch set. The pair of capacitors 204 and 206 has an associated switch set that includes transistors 220, 222, and 224. The gate electrodes of transistors 220, 222, and 224 are connected to a tuning signal 226. The channel electrodes of transistor 220 are connected between electrode 214 of capacitor 204 and electrode 218 of capacitor 206. The channel electrodes of transistor 222 are connected between electrode 214 of capacitor 204 and ground, and the channel electrodes of transistor 224 are connected between electrode 218 of capacitor 206 and ground.

The tuning signal 226 controls transistors 220, 222, and 224. When the control voltage of tuning signal 226 exceeds the threshold voltages of transistors 222 and 224, transistors 222 and 224 set the channel electrodes of transistor 220 to the bias voltage of ground. When the control voltage of tuning signal 226 exceeds this bias voltage by more than the threshold voltage of transistor 220, then transistor 220 couples the electrode 214 of capacitor 204 to the electrode 218 of capacitor 206. In contrast, when the control voltage of tuning signal 226 does not exceed the threshold voltages of transistors 220, 222, and 224, then transistor 220 does not couple capacitors 204 and 206. Thus, transistors 220, 222, and 224 selectively couple or decouple capacitors 204 and 206 depending on the control voltage of tuning signal 226. Similarly, transistors 230, 232, and 234 selectively couple or decouple the pair of capacitors 208 and 210 in response to tuning signal 236.

Varactors 240 and 241 provide matched capacitances that are continuously variable in response to a tuning signal 242. The control electrodes of the varactors 240 and 241 are coupled together and to the tuning signal 242, and the inductor 104 is coupled across the series combination of varactors 240 and 241. When the switch sets decouple all of capacitors 204 and 206 through 208 and 210, tunable resonant circuit 101 resonates between the inductance of inductor 104 and the capacitance of varactors 240 and 241 together with certain parasitic capacitances. Thus, varactors 240 and 241 tune the oscillation frequency of the resonator circuit 100 when the switch sets decouple all of capacitors 204 and 206 through 208 and 210. When the switch sets instead couple some or all of the capacitors 204 and 206 through 208 and 210, varactors 240 and 241 fine tune the resonance of tunable resonant circuit 101 and the oscillation frequency of resonator circuit 100.

The tunable resonant circuit 101 has symmetry that produces differential operation. For example, because capacitors 204 and 206 have a matched capacitance, during oscillation of tunable resonant circuit 101 the voltage at electrode 214 is rising when the voltage at electrode 218 is falling at the same rate, and vice versa. While tuning signal 226 exceeds the threshold voltages of transistors 222 and 224, transistors 222 and 224 set the common mode to ground for the differential oscillations between electrodes 214 and 218. Thus, the differential voltage across the channel electrodes of transistor 220 is twice the voltage at electrodes 214 and 218 individually, and for a specified amount of channel resistance, the size of transistor 220 is half the size that would be required for transistors (such as transistors 222 and 224) that do not operate differentially.

In one embodiment, transistors 222 and 224 are small transistors setting the DC bias voltage of the channel electrodes of transistor 220, and transistor 220 is a relatively large transistor sized to provide a channel resistance during differential conduction that matches a target channel resistance. Because capacitors 204 and 206 block any DC paths to electrodes 214 and 218, transistors 222 and 224 can be very small transistors that only conduct leakage currents to set the bias voltage at the channel electrodes of transistor 220.

The quality factor, Q, for the tunable resonant circuit 101 is the ratio of its reactance to its resistance. The quality factor gives the resonance bandwidth, and the frequency jitter of resonator circuit 100 reduces with increasing quality factor of the tunable resonant circuit 101. In one embodiment, transistors 220 and 230 are sized to have a channel resistance during differential conduction that matches a target channel resistance given by the target Q.

For the resonator circuit 100, the tuning range is given by the maximum achievable capacitance and inductance and by the minimum achievable capacitance and inductance. The maximum achievable capacitance is the matched capacitances of varactors 240 and 241, and capacitors 204 and 206 through capacitors 208 and 210. Although capacitors 204 and 206 through 208 and 210 are disconnected from the resonating circuit when tuning signals 226 and 236 turn off transistors 220, 222, and 224 through transistors 230, 232, and 234, capacitors 204 and 206 through 208 and 210 still contribute to the minimum achievable capacitance through certain parasitic capacitances present in an actual implementation of the tunable resonant circuit 101. For example, capacitor 204 provides a parasitic capacitance to ground, and capacitor 204 is in series with a parasitic capacitance of transistor 220.

Various embodiments of the invention reduce the minimum achievable capacitance and increase the maximum achievable inductance to extend the tuning range of the tunable resonant circuit 101 and thereby extend the frequency range of the resonator circuit 100.

The differential operation of tunable resonant circuit 101 helps reduce the minimum achievable capacitance. Because transistor 220 differentially couples capacitors 204 and 206, transistor 220 is half the size that would be required for an implementation that does not operate differentially. Cutting the size of transistor 220 in half also cuts the parasitic capacitances of transistor 220 in half. This reduces the minimum achievable capacitance and extends the tuning range of the tunable resonant circuit 101. Note that transistors 222 and 224 have small parasitic capacitances, because transistors 222 and 224 are small transistors.

Current source 102 produces a current bias for the cross-coupled transistors 114 and 116. Current source 102 delivers the current bias to cross-coupled transistors 114 and 116 through a center tap of inductor 104. The cross-coupled transistors 114 and 116 provide a negative resistance that enables oscillation when the negative resistance equals or exceeds the resistances in the tunable resonant circuit 101. Current source 102 produces a current bias that adjusts the negative resistance that cross-coupled transistors 114 and 116 produce.

Current source 102 includes two sets of current mirrors. The first set of current mirrors 250, 252, 254, 256, and 258 scales a reference bias from reference signal 261 to produce an operating-point bias on line 262, and the second set of current mirrors 264, 266, 268 through 270 scales the operating-point bias to produce the current bias for the cross-coupled transistors 114 and 116.

Scaling signals 272, 274, 276, and 278 control the first set of current mirrors 250, 252, 254, 256, and 258. Scaling signal 272 enables and disables current mirrors 250 and 252, and an enabled current mirror 252 produces a minimum operating-point bias that is equal to (or a scaling of) the reference bias. Similarly, scaling signals 274, 276, and 278 enable and disable current mirrors 254, 256, and 258, respectively.

In one embodiment, current mirror 254 is the same size as current mirror 252, current mirror 256 is twice the size of current mirror 252, and current mirror 258 is four times the size of current mirror 252. Thus, current mirrors 252, 254, 256, and 258 produce the operating-point bias that is the reference current scaled by various powers of two.

Independently, tuning signals 280 and 226 through 236 control the second set of current mirrors 264, 266, 268, and 270. Tuning signal 280 enables and disables current mirrors 264 and 266, and tuning signals 226 though 236 enable and disable current mirrors 268 through 270.

In one embodiment, the tuning signal 226 controlling current mirror 268 is the same tuning signal controlling transistors 220, 222, and 224; and the tuning signal 236 controlling current mirror 270 is the same tuning signal controlling transistors 230, 232, and 234. When tuning signals 226 through 236 selectively decouple all pairs of capacitors 204 and 206 through 208 and 210, an enabled current mirror 266 sets the current bias for the cross-coupled transistors 114 and 116 equal to (or a scaling of) the operating-point bias from the first set of current mirrors 250, 252, 254, 256, and 258. When tuning signal 226 couples capacitors 204 and 206, current mirror 268 is enabled and adds a scaling of the operating-point bias to the current bias. Current mirror 268 is sized to produce an additional current bias causing cross-coupled transistors 114 and 116 to produce a negative resistance that compensates for the resistance though the series combination of capacitor 204, transistor 220, and capacitor 206. Similarly, current mirror 270 is sized to produce an additional current bias that compensates for the resistance through the series combination of capacitor 208, transistor 230, and capacitor 210. Thus, current mirrors 266 and 268 through 270 produce the current bias for cross-coupled transistors 114 and 116 that is the operating-point current scaled to compensate for resistances including the channel resistances of transistors 220 through 230. The resistance varies with frequency, therefore, controls 226 and 236, which control the frequency of the resonant circuit, also set the current bias to compensate for the resistance variation.

The current bias from current source 102 also helps vary the achievable capacitance for tunable resonant circuit 101. The cross-coupled transistors 114 and 116 have parasitic capacitances from their gate electrodes to ground that increase as their gate voltages increase. As the current bias increases, the gate voltage of cross-coupled transistors 114 and 116 increases, which in turn increases the parasitic capacitances from the gate electrodes of cross-coupled transistors 114 and 116 to ground. The current bias increase also increases the negative resistance produced by the cross-coupled transistors 114 and 116 which increases the oscillation amplitude. Thus, the current bias should provide enough negative resistance to ensure oscillation, but the current bias should not provide more negative resistance because this increases the parasitic capacitances of cross-coupled transistors 114 and 116 to ground.

In one embodiment, scaling signals 272, 274, 276, and 278 are used to select an operating-point bias that is just sufficient to ensure oscillation when tuning signals 226 through 236 decouple all pairs of capacitors 204 and 206 through 208 and 210. When tuning signals 226 through 236 selectively couple some or all pairs of capacitors 204 and 206 through 208 and 210, current mirrors 264, 266, 268, and 270 scale this operating-point bias to ensure continued oscillation by compensating for the channel resistances of coupling transistors 220 through 230. When all the pairs of capacitors 204 and 206 through 208 and 210 are switched on to get a minimum frequency in the tunable resonant circuit 101, the parasitic resistance in the tunable resonant circuit 101 is higher so current mirrors 268 through 270 are set to increase the current bias. The increased current bias increases the parasitic capacitance to reduce the resonance frequency of the tunable resonant circuit 101. Similarly, when all the pairs of capacitors 204 and 206 through 208 and 210 are switched off to get a maximum frequency in the tunable resonant circuit 101, the parasitic resistance is lower so current mirrors 268 through 270 are set to decrease the current bias. The reduced current bias reduces the parasitic capacitance to further increase the resonance frequency of the tunable resonant circuit 101.

Various embodiments of the invention also increase the maximum achievable inductance to extend the tuning range of the tunable resonant circuit 101. In one embodiment, the inductance of inductor 104 is included in both the maximum achievable inductance and the minimum achievable inductance. However, the wiring that connects inductor 104 to the various capacitances and the cross-coupled transistors 114 and 116 has parasitic inductances represented by parasitic inductors 282 and 284 through 286 and 288. The layout of the variable oscillator tends to include these parasitic inductances in the maximum achievable inductance and does not include these parasitic inductances in the minimum achievable inductance.

Figure 3:
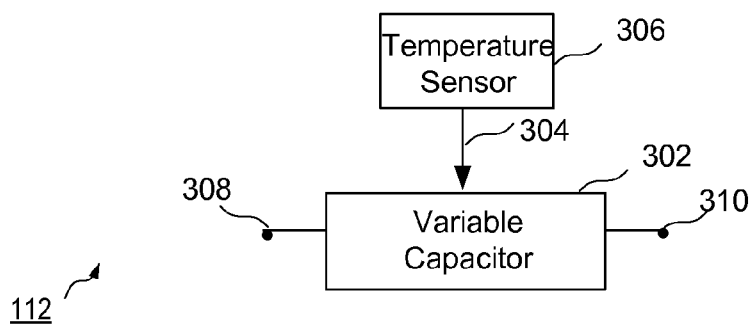
FIG. 3 is a block diagram of a temperature compensation circuit of the resonator circuit of FIG. 1 according to an embodiment.

Turning now to FIG. 3, a block diagram of a temperature compensation circuit of the resonator circuit 100 of FIG. 1 is shown. As shown in FIG. 3, the temperature compensation circuit 112 comprises a variable capacitor 302 receiving a temperature control signal 304 generated by a temperature sensor 306. The terminals 308 and 310 of the variable capacitor are coupled to the outputs 108 and 110, respectively. The temperature sensor 306 could comprise any circuit which generates a variable output in response to changes in temperature. The temperature sensor preferably comprises a circuit which generates a temperature control signal that is linearly proportional to changes in temperature.

Figure 4:
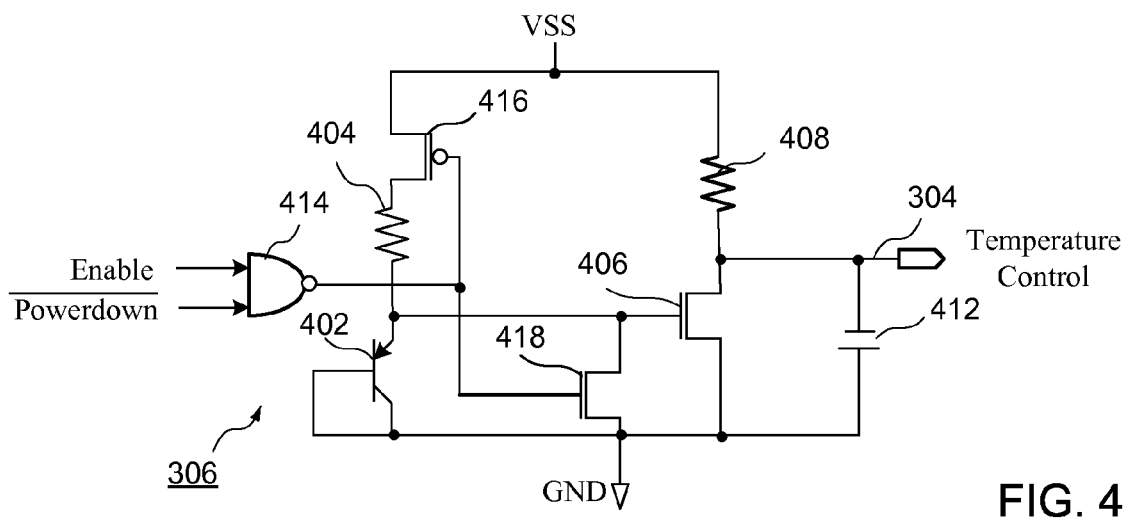
FIG. 4 is a block diagram of a temperature sensor of the temperature compensation circuit of FIG. 3 according to an embodiment.

One example of a temperature sensor which generates a linear temperature control signal is shown in FIG. 4. The temperature sensor of FIG. 4 is based upon the properties of a bipolar junction transistor. In particular, a bipolar junction transistor 402 comprises an emitter coupled to a resistor 404, while the base and the collector are coupled to ground. The emitter of the transistor 402 is also coupled to the gate of an n-channel MOS transistor 406 having a drain coupled to a resistor 408 and a source coupled to ground. The transistor 406 functions to amplify the voltage generated at the emitter of the transistor 402 to generate a temperature control signal at a temperature control signal line 304. A capacitor 412 is provided at the control signal line 304. A control circuit 414 comprising a NAND gate 414 receives control signals for disabling the temperature compensation circuit to reduce power. Therefore, if the circuit is not enabled or is in a power down mode, transistor 416 is turned off and transistor 418 is turned on to turn off transistor 406 and therefore reduce leakage current.

Accordingly, the transistor 402 is used to sense thermal variation, and an amplifier is used to generate the temperature control signal to control a varactor or a set of varactors in the VCO to counteract the frequency drift due to variations in temperature. For example, when the integrated circuit is cold (e.g. minus 40 deg C.), the VCO frequency is expected to be faster so the varactors are adjusted to increase the capacitance to maintain the desired frequency. In contrast, when the temperature of the integrated circuit is hot (e.g. 100 deg C.), the varactors are adjusted to decrease the capacitance to maintain a near constant frequency at the desired frequency for a given control voltage. The capacitance varies as a function of temperature, and therefore the varactor must be adjusted to maintain a constant frequency with changes in temperature. The base emitter voltage (Vbe) of the transistor 402 linearly decreases with increases in temperature, and drives a common source amplifier to set the voltage for a varactor or set of varactors in the VCO. Therefore, the temperature compensation circuit allows the VCO to maintain a near constant frequency output and maintain optimal jitter performance.

Figure 5:
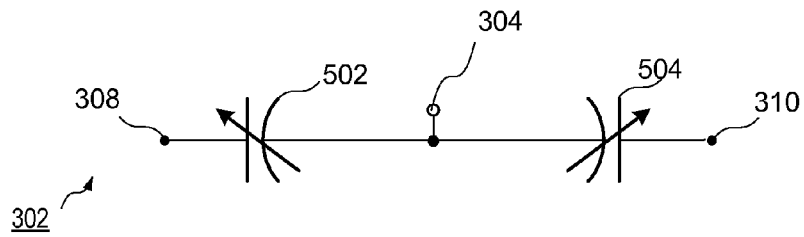
FIG. 5 is a block diagram of a variable capacitor of the temperature compensation circuit of FIG. 3 according to an embodiment.

Turning now to FIG. 5, a block diagram of a varactor of the temperature compensation circuit 112 of FIG. 3 is shown. The circuit of FIG. 5 comprises a first variable capacitor 502 and a second variable capacitor 504 each having a control terminal coupled to the temperature control signal line 304. As set forth above with respect to FIGS. 3 and 4, the voltage of the temperature control signal line will adjust the capacitance of the series capacitors 502 and 504 between the nodes 108 and 110. Accordingly, the circuit of FIG. 5 enables DC capacitive coupling between the nodes 108 and 110. While a single pair of capacitors 502 and 504 is shown, a number of pairs of capacitors could be implemented.

Figure 6:
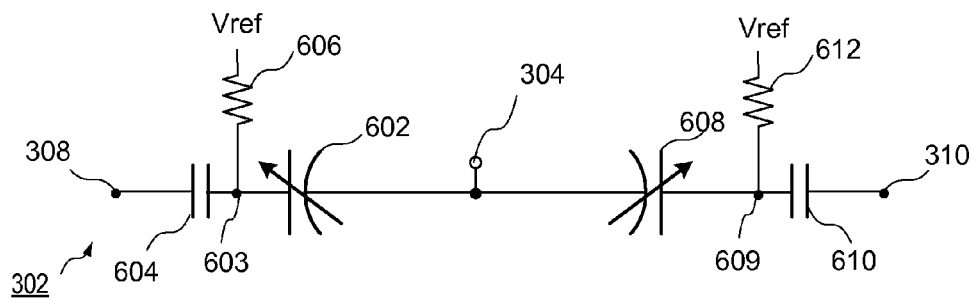
FIG. 6 is a block diagram of a variable capacitor of the temperature compensation circuit of FIG. 3 according to an alternate embodiment.

Turning now to FIG. 6, a block diagram shows a variable capacitor of the temperature compensation circuit 112 of FIG. 3 according to an alternate embodiment which enables AC coupling between 108 and 110. As shown in FIG. 6, a varactor 602 has a control terminal coupled to the temperature control signal line 304, and a second terminal coupled at a node 603 to a first terminal of a capacitor 604. A second terminal of the capacitor 604 is coupled to the variable capacitor terminal 308. A resistor 606 is coupled between a reference voltage (Vref) and the node 603. Similarly, a varactor 608 has a control terminal coupled to the temperature control signal line 304, and a second terminal coupled at a node 609 to a first terminal of a capacitor 610. A second terminal of the capacitor 610 is coupled to the variable capacitor terminal 310. A resistor 612 is coupled between the reference voltage (Vref) and the node 609. The temperature control signal will control the capacitance of the varactors 602 and 608, and therefore, maintain the output frequency of the resonator circuit 100.

It should be noted that while varactors are provided in the embodiments of FIGS. 5 and 6, capacitors which are switched in or out of the circuit could be implemented in the temperature compensation circuit 302 instead, where the number of capacitors, and therefore the total capacitance between terminals 308 and 310 of the variable capacitor, is selected based upon the number of capacitors which are switched in. An example of a capacitor circuit which could be implemented in the variable capacitor 302 could be the circuit of FIG. 2 which switches capacitors 204-210 in or out of the circuit. The capacitors would be switched in or out based upon the temperature control signal. Accordingly, the capacitance at the output 308 and 310 of the variable capacitor circuit 302 could be selected, and changed with variations in temperature, based upon capacitor blocks which are switched in or out to achieve a certain capacitance between nodes 108 and 110. Further, although a varactor circuit having varactors 240 and 241 which provides DC capacitive coupling is used in the circuit of FIG. 2, a circuit providing AC capacitive coupling, such as the circuit of FIG. 6 for example, could be implemented in place of varactors 240 and 241.

Figure 7:
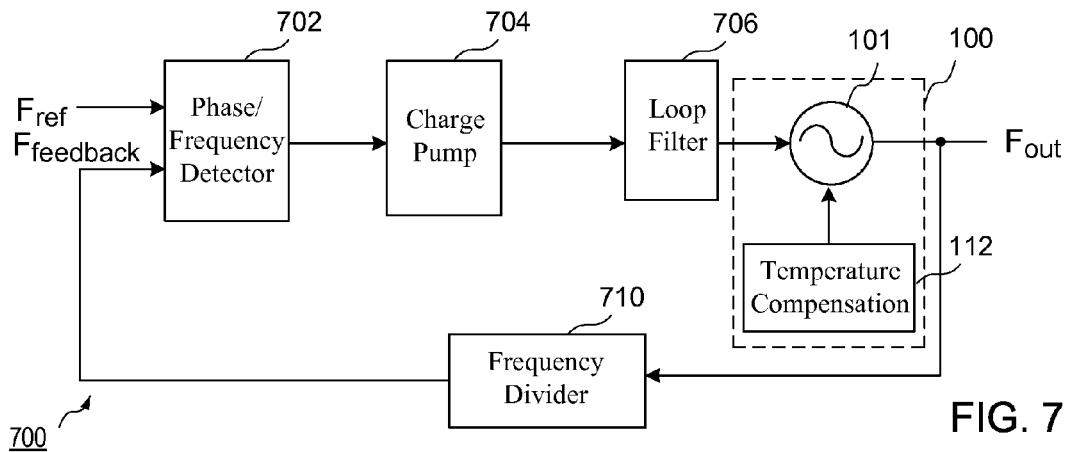
FIG. 7 is a block diagram of a phase locked loop incorporating the resonator circuit of FIG. 1 according to an embodiment.

Turning now to FIG. 7, a block diagram of a phase locked loop (PLL) 700 incorporating the resonator circuit is shown. PLL 700 exemplifies a charge-pump based PLL, which is a PLL design implementation that facilitates flexible design tradeoffs by decoupling various design parameters, such as loop bandwidth, damping factor, and lock range. PLL 700 consists of a phase/frequency detector 702 that receives a reference signal $F_{ref}$ and a feedback signal $F_{feedback}$, a charge pump 704, and a loop filter 706 coupled to the resonator circuit 100 which generates an output signal $F_{out}$.

Clock division may be necessary, for example, when the frequency of the output signal $F_{out}$ of the tunable resonant circuit 100 is operating in a high frequency range, such as 5 gigahertz (GHz), but reference signal $F_{ref}$ may only be operating at a relatively low frequency range, such as 156.25 megahertz (MHz). Accordingly, frequency divider 710 enables generating a signal having a lower frequency, as is well known in the art. In operation, phase/frequency detector 702 supplies digital signals, e.g., UP and DN, and their complementary signals, e.g., $\overline{UP}$ and $\overline{DN}$, corresponding to a phase/frequency error between $F_{ref}$ and $F_{feedback}$ output by the frequency divider 710. For example, if the phase/frequency of $F_{feedback}$ is lagging the phase/frequency of $F_{ref}$, then the pulse width of signal UP may be increased and the pulse width of signal DN may be decreased to cause the phase/frequency of the resonator circuit 100 to be advanced in phase/frequency. Conversely, if the phase/frequency of $F_{feedback}$ is advanced with respect to the phase/frequency of signal $F_{ref}$, then the pulse width of signal UP may be decreased and the pulse width of signal DN may be increased to cause the phase/frequency of the resonator circuit 100 to be retarded in phase/frequency.

Charge pump 704 reacts to the phase/frequency error signals output by the phase/frequency detector 702 by generating a current signal. For example, if the pulse width of signal UP is increased, the magnitude of the current signal may also increase. Conversely, if the pulse width of signal DN is increased, then the magnitude of the current signal may also decrease. The current signal is then converted into an error voltage, $V_{error}$, by loop filter 706, which is then supplied to resonator circuit 100 to set the output frequency, $F_{out}$, of the resonator circuit 100. $V_{error}$ may control one or more capacitors of the resonator circuit 110, for example. Through negative feedback, the phase/frequency error between $F_{ref}$ and $F_{feedback}$ is forced to be substantially zero through operation of the resonator circuit 100.

Figure 8:
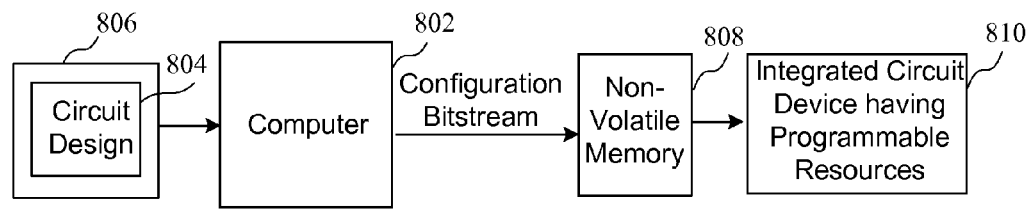
FIG. 8 is a block diagram of a system for programming a device having programmable resources according to an embodiment.

Turning now to FIG. 8, a block diagram of a system for programming a device having programmable resources according to an embodiment is shown. The circuit of FIG. 8 could be used for example to configure an integrated circuit having the resonator circuit 100, where the frequency of the resonator circuit is determined by a configuration bitstream provided to the integrated circuit device. In particular, a computer 802 is coupled to receive a circuit design 804 from a memory 806, and generate a configuration bitstream which is stored in the non-volatile memory 808. The non-volatile memory 808 may be a Flash memory, for example. As will be described in more detail below, the circuit design may be a high level design, such as a circuit design defined in a hardware description language (HDL). Also, the computer may be configured to run software that generates a configuration bitstream which is stored in the non-volatile memory 808 and then provided to a device 810 having programmable resources. As will be described in more detail below, the device 810 may be any type of integrated circuit having programmable resources, such as a programmable logic device, or an application specific integrated circuit having programmable resources.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 802 may implement the portions of a circuit design implementing certain functions in configurable logic blocks (CLBs) or digital signal processing (DSP) blocks, for example. An example of a synthesis tool is the ISE® tool available from Xilinx, Inc. of San Jose, Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen available from Xilinx, Inc. of San Jose, Calif. The bitstream may also be encrypted according to a predetermined encryption standard. The bitstream is either downloaded by way of a cable or programmed into an EPROM for delivery to the programmable integrated circuit. If encoded, the bitstream is then decoded by the programmable integrated circuit according to the predetermined encryption standard.

Figure 9:
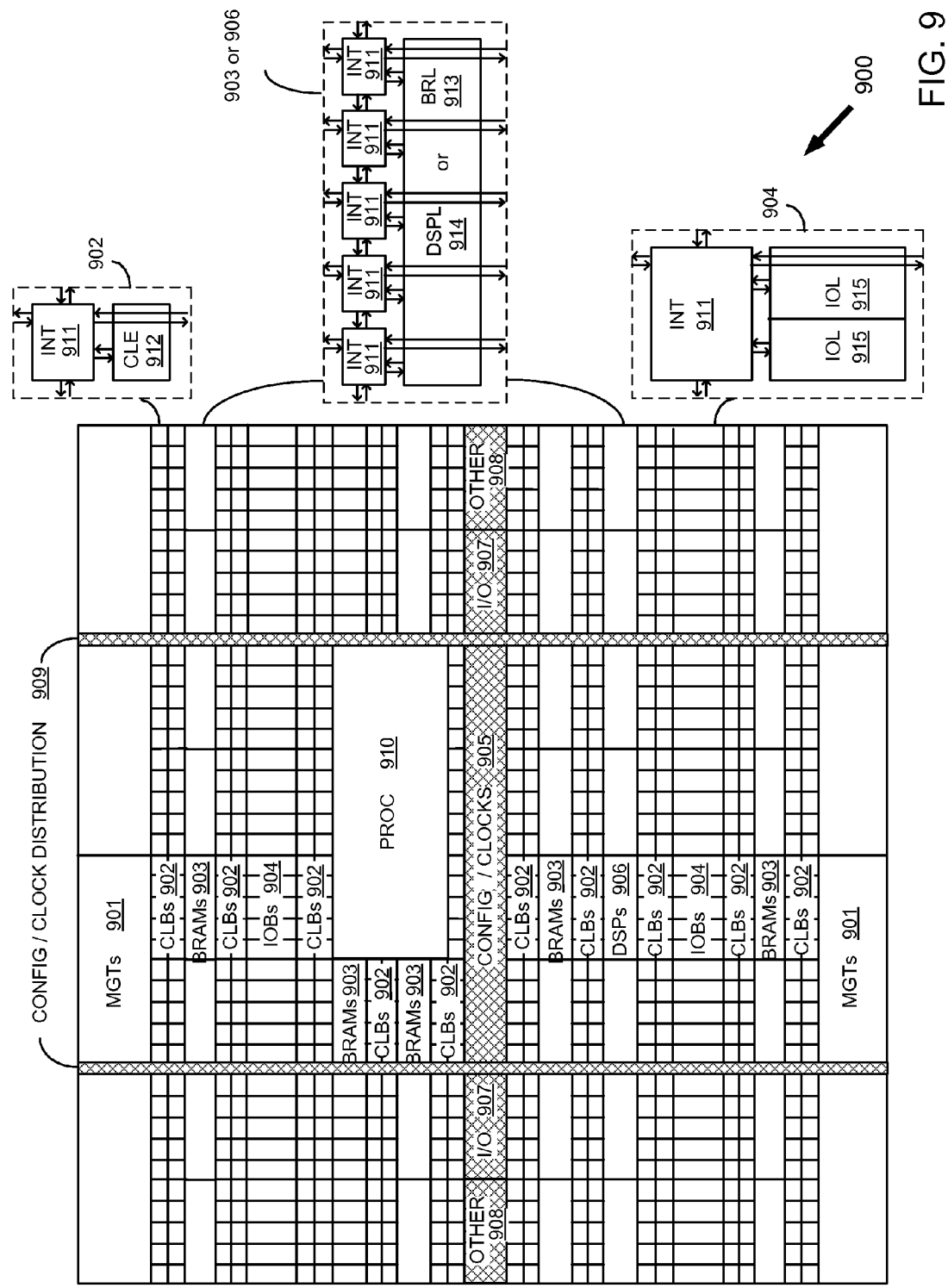
FIG. 9 is a block diagram of a device having programmable resources according to an embodiment of the present invention.

Turning now to FIG. 9, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 906 may include a DSP logic element (DSPL) 914 in addition to an appropriate number of programmable interconnect elements. An 10B 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While the embodiment of FIG. 9 relates to an integrated circuit having programmable resources, it should be understood that the circuits and methods set forth in more detail below could be implemented in any type of ASIC.

Figure 10:
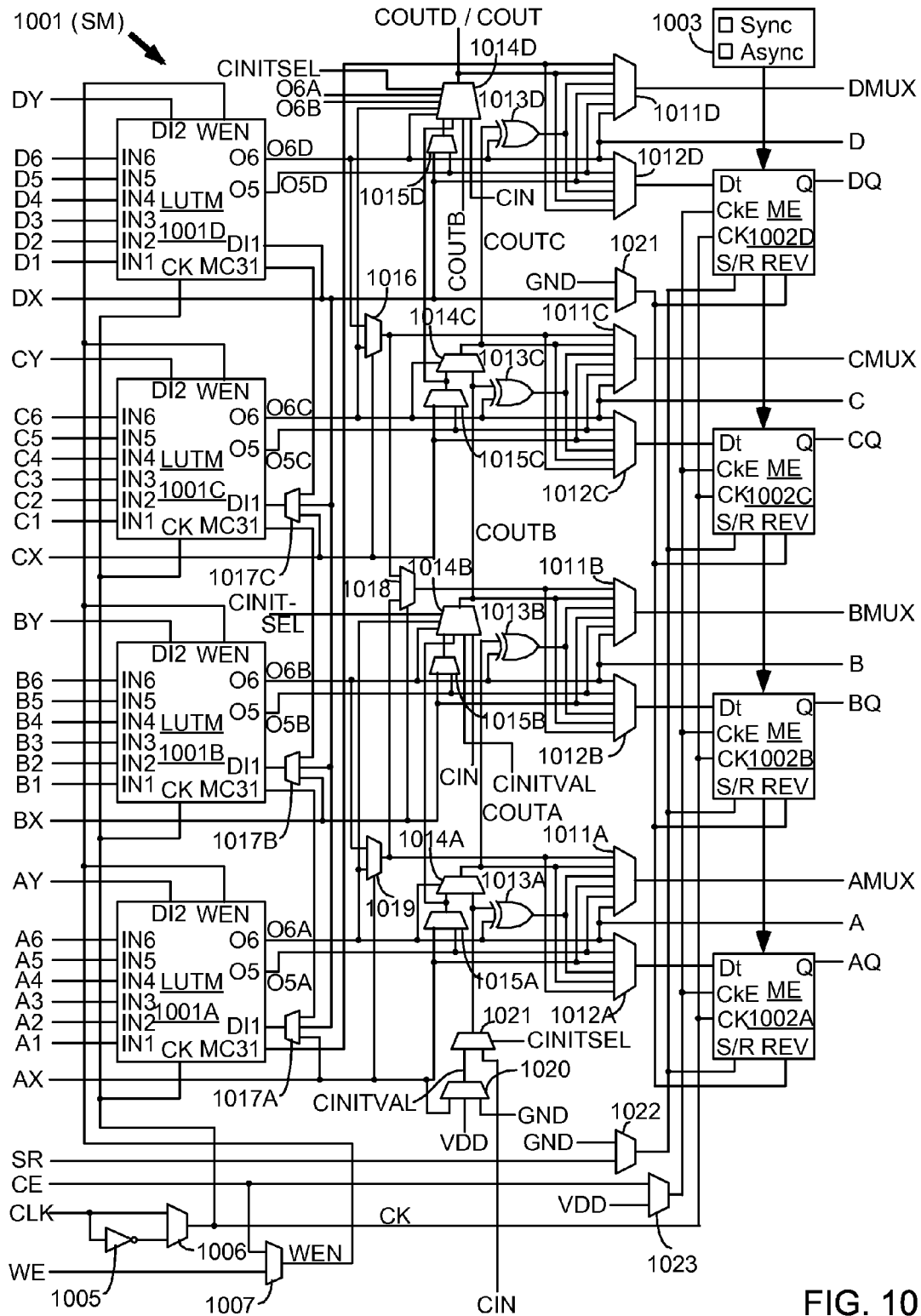
FIG. 10 is block diagram of a configurable logic element of the device of FIG. 9 according to an embodiment.

Turning now to FIG. 10, a block diagram of a configurable logic element according to an embodiment is shown. In particular, FIG. 10 illustrates in simplified form a configurable logic element of a configuration logic block 902 of FIG. 9. In the embodiment of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the embodiment of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX. Accordingly, the circuits and methods set forth above may be implemented in a device such as the devices of FIGS. 9 and 10, or any other suitable device.

Figure 11:
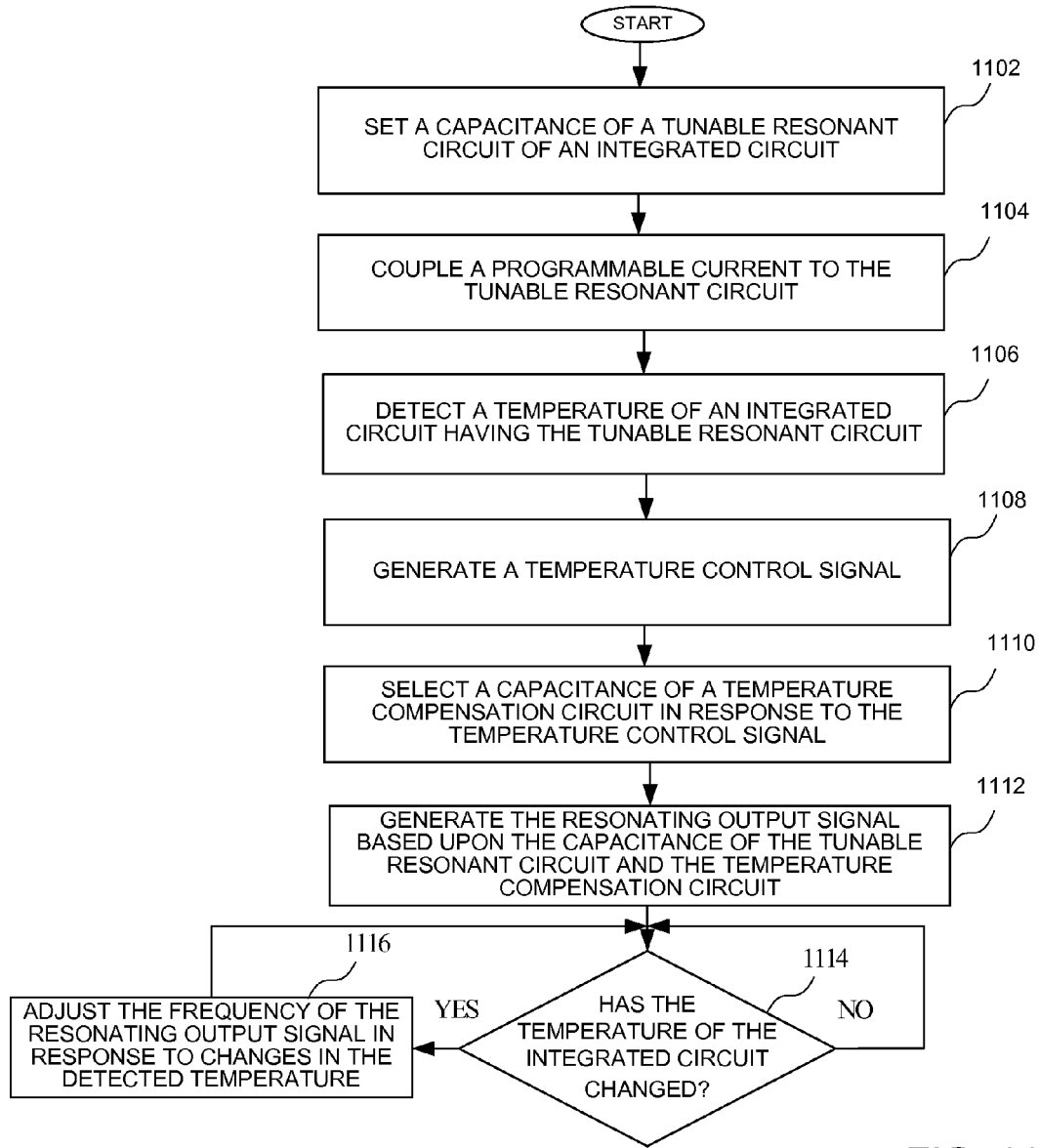
FIG. 11 is a flow chart showing a method of generating a resonating output signal according to an embodiment.

Turning now to FIG. 11, a flow chart shows a method of generating a resonating output signal. In particular, a capacitance of a tunable resonant circuit is set at a block 1102. A programmable current is coupled to the tunable resonant circuit at a block 1104. A temperature of an integrated circuit generating the resonating output signal is detected at a block 1106. A temperature control signal is generated at a block 1108. A capacitance of a temperature compensation circuit is selected in response to the temperature control signal at a block 1110. The resonating output signal is then generated based upon the capacitance of the tunable resonant circuit and the temperature compensation circuit at a block 1112. The temperature control signal is periodically updated at a block 1114. In particular, it is determined whether the temperature of the integrated circuit has changed at the block 1114. If so, the frequency of the resonating output signal is adjusted in response to changes in the detected temperature at a block 1116. The method of FIG. 11 could be implemented using any of the circuits of FIGS. 1-10, for example, or any other suitable circuits.

It can therefore be appreciated that the new and novel resonator circuit and method of generating a resonating output signal has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A resonator circuit enabling temperature compensation, the resonator circuit comprising:
    an inductor coupled between a first node and a second node of the resonator circuit;
    a capacitor circuit coupled between the first node and the second node; and
    a temperature compensation circuit coupled between the first node and the second node,
    wherein the resonator circuit is coupled to receive a current signal from a programmable current source; and
    wherein the temperature compensation circuit comprises a varactor coupled to receive a temperature control signal that sets a capacitance of the varactor, and a first resistor coupled to an emitter of a bipolar junction transistor and to a gate of an MOS transistor, wherein the temperature control signal is generated by the MOS transistor, and a gate of the MOS transistor is coupled to receive a voltage generated at the emitter of the bipolar junction transistor.

2. The resonator circuit of claim 1, further comprising:
    a first transistor having a first terminal coupled to the first node and a second terminal coupled to a ground potential; and
    a second transistor having a third terminal coupled to the second node and a fourth terminal coupled to the ground potential,
    wherein a first control terminal of the first transistor is coupled to the second node and a second control terminal of the second transistor is coupled to the first node.

3. The resonator circuit of claim 1, wherein:
    the capacitor circuit comprises a variable capacitor coupled to receive a tuning signal; and
    the resonator circuit generates an output signal of a predetermined frequency in response to the tuning signal.

4. The resonator circuit of claim 1, wherein the capacitor circuit comprises a plurality of varactors coupled to receive tuning signals for enabling the resonator circuit to generate an output of a predetermined frequency.

5. The resonator circuit of claim 1, wherein the temperature compensation circuit generates a linear output as a function of a temperature of an integrated circuit having the resonator circuit.

6. The resonator circuit of claim 1, wherein the resonator circuit is implemented in a phase locked loop circuit.

7. A resonator circuit enabling temperature compensation, the resonator circuit comprising:
    an inductor coupled between a first node and a second node of the resonator circuit;
    a capacitor circuit coupled in parallel with the inductor between the first node and the second node;
    a temperature sensor generating a temperature control signal, the temperature sensor having a first resistor coupled to an emitter of a bipolar junction transistor and to a gate of an MOS transistor, wherein the temperature control signal is generated by the MOS transistor, and a gate of the MOS transistor is coupled to receive a voltage generated at the emitter of the bipolar junction transistor; and
    a varactor coupled between the first node and the second node, the varactor receiving the temperature control signal to set a capacitance of the varactor;
    wherein the resonator circuit is coupled to receive a current signal from a programmable current source.

8. The resonator circuit of claim 7, wherein:
    the capacitor circuit comprises a varactor; and
    the resonator circuit generates an output signal of a predetermined frequency in response to the current signal and the temperature control signal.

9. The resonator circuit of claim 8, wherein the capacitor circuit comprises a plurality of varactors coupled to receive tuning signals for enabling the resonator circuit to generate an output of a predetermined frequency.

10. The resonator circuit of claim 7, wherein the temperature sensor generates a linear output as a function of temperature.

11. The resonator circuit of claim 7, wherein the temperature sensor adjusts a frequency of the resonator circuit in response to changes in temperature.

12. A method of generating a resonating output signal, the method comprising:
    setting a capacitance of a tunable resonant circuit;
    coupling a programmable current to the tunable resonant circuit;
    detecting a temperature of an integrated circuit having the tunable resonant circuit using a resistor coupled to an emitter of a bipolar junction transistor and to a gate of an MOS transistor;
    generating a temperature control signal at a drain of the MOS transistor, wherein the MOS transistor is coupled to receive, at the gate of the MOS transistor, a voltage generated at the emitter of the bipolar junction transistor;
    selecting a capacitance of a temperature compensation circuit in response to the temperature control signal; and generating the resonating output signal based upon the capacitance of the tunable resonant circuit and the capacitance of the temperature compensation circuit.

13. The method of claim 12, further comprising periodically updating the temperature control signal.

14. The method of claim 12, further comprising adjusting a frequency of the resonating output signal in response to changes in the detected temperature.

15. The method of claim 12, wherein generating a temperature control signal comprises generating a linear control signal that is linearly proportional to a temperature of an integrated circuit having the resonant circuit.

16. The method of claim 12, wherein generating the resonating output signal comprises generating an output of a phase locked loop.

* * * * *